(12) United States Patent  
Sato et al.

(10) Patent No.: US 8,878,218 B2  
(45) Date of Patent: Nov. 4, 2014

(54) SEMICONDUCTOR LIGHT-EMITTING DEVICE AND METHOD FOR MANUFACTURING THE SAME

(71) Applicant: Nichia Corporation, Tokushima (JP)

(72) Inventors: Kosuke Sato, Anan (JP); Yoshitaka Sumitomo, Tokushima (JP); Dai Wakamatsu, Itano-gun (JP); Yoshiyuki Aihara, Tokushima (JP); Kimihiro Miyamoto, Tokushima (JP); Satoshi Kinoshita, Tokushima (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 14/054,868

(22) Filed: Oct. 16, 2013

(65) Prior Publication Data

US 2014/0103379 A1 Apr. 17, 2014

(30) Foreign Application Priority Data

Oct. 17, 2012 (JP) .................................. 2012-229818

(51) Int. Cl.
*H01L 33/00* (2010.01)
*H01L 33/10* (2010.01)

(52) U.S. Cl.
CPC .............. *H01L 33/10* (2013.01); *H01L 33/005* (2013.01)
USPC ........................................................ 257/98

(58) Field of Classification Search
CPC ......... H01L 33/08; H01L 33/18; H01L 33/16; H01L 33/005; H01L 33/10; H01L 33/26; H01L 33/42; H01L 33/0045

USPC ................................................ 257/79, 98, 99
See application file for complete search history.

(56) References Cited

U.S. PATENT DOCUMENTS

| 2001/0028062 | A1 | 10/2001 | Uemura et al. | |
| 2004/0104395 | A1* | 6/2004 | Hagimoto et al. | 257/79 |
| 2008/0073659 | A1* | 3/2008 | Tamura et al. | 257/97 |

FOREIGN PATENT DOCUMENTS

| JP | 10-270754 A | 10/1998 |
| JP | 2001-284642 A | 10/2001 |
| JP | 2008-153362 A | 7/2008 |
| JP | 2010-199335 A | 9/2010 |

* cited by examiner

*Primary Examiner* — Brook Kebede
(74) *Attorney, Agent, or Firm* — Antonelli, Terry, Stout & Kraus, LLP.

(57) ABSTRACT

The invention provides semiconductor light-emitting devices which have a semiconductor layer on a principal surface of a translucent substrate and a reflective layer on a second principal surface opposite to the principal surface having the semiconductor layer, which enables that the peeling of the reflective layer from the translucent substrate is suppressed. A semiconductor light-emitting device includes a first metal layer disposed in contact with a second principal surface of a translucent substrate, a second metal layer disposed in contact with at least the second principal surface or a side surface of the translucent substrate around the first metal layer, and a third metal layer disposed on the second metal layer. The first metal layer has a reflectance with respect to a peak wavelength of light emitted from an emitting layer higher than the reflectance of the second metal layer. The second metal layer has an adhesion with respect to the translucent substrate higher than the adhesion between the first metal layer and the translucent substrate.

27 Claims, 7 Drawing Sheets

SEMICONDUCTOR LIGHT-EMITTING DEVICE AND METHOD FOR MANUFACTURING THE SAME

CROSS REFERENCE TO RELATED APPLICATION

This application claims the priority of Japanese Application No. 2012-229818, filed on Oct. 17, 2012, the entire specification, claims and drawings of which are incorporated herewith by reference.

FIELD OF THE INVENTION

The present invention relates to semiconductor light-emitting devices having a semiconductor layer on a principal surface of a translucent substrate as well as a metal layer on the surface opposite to the principal surface of the translucent substrate, and to methods for manufacturing such semiconductor light-emitting devices.

DESCRIPTION OF THE RELATED ART

Patent Literature 1 (JP H10-270754 A) describes a semiconductor light-emitting device characterized in that a plurality of semiconductor layers including an emitting layer are stacked on a translucent substrate and that a reflective layer for reflecting the light from the emitting layer is disposed on the backside of the translucent substrate. Further, Patent Literature 1 describes that the reflective layer is a metal film or a dielectric reflective film in which two types of dielectric layers having different refractive indexes are stacked alternately on top of one another.

Patent Literature 2 (JP 2001-284642 A) describes a semiconductor light-emitting device in which a plurality of semiconductor layers consisting of Group III nitride compound semiconductor are stacked on a substrate by the crystal growth of Group III nitride compound semiconductors. This semiconductor light-emitting device is characterized in that a mirror section is disposed on a surface of the substrate opposite to the emitting layer side by sequentially stacking a translucent layer of a translucent metal oxide or a translucent ceramic, a metallic reflective layer for reflecting the light from the emitting layer toward the substrate, and an anticorrosion layer of a metal oxide or a ceramic.

Patent Literature 3 (JP. 2010-199335 A) describes a semiconductor light-emitting device which has a semiconductor light-emitting device structure including at least an emitting layer, on a first principal surface of a translucent substrate having the first principal surface and a second principal surface. This semiconductor light-emitting device is characterized in that the device has, on the second principal surface, a reflective layer for reflecting the light from the emitting layer in the semiconductor light-emitting device structure, an insulating layer covering the top surface of the reflective layer opposite to the translucent substrate as well as the side surface of the reflective layer, and an adhesive layer disposed on the top surface of the second metal layer opposite to the reflective layer. Further, Patent Literature 3 describes that the reflective layer includes one selected from Al, Ag, Al alloys, Ag alloys, Rh and Pt, and the insulating layer may include a metal oxide such as $SiO_2$, $TiO_2$ or $Nb_2O_5$.

PRIOR ART DOCUMENTS

Patent Literatures

Patent Literature 1: JP H10-270754 A
Patent Literature 2: JP 2001-284642 A
Patent Literature 3: JP. 2010-199335 A

BRIEF SUMMARY OF THE INVENTION

However, a reflective metal layer disposed on a translucent substrate is easily separated at its periphery due to weak adhesion (low sticking force) between the translucent substrate and the metal layer because the materials are different from each other. In particular, the formation of a metal layer made of Ag on a surface of a sapphire substrate as a translucent substrate often encounters a problem in that the metal layer is separated not only at its periphery but also at inner locations with the result that the metal layer is detached from the sapphire substrate.

To solve the above problems, the present invention has an object of providing semiconductor light-emitting devices, which have a semiconductor layer on a principal surface of a translucent substrate and a metal layer on the other surface of the substrate, which enables that the peeling of the metal layer from the translucent substrate is suppressed.

To solve the above problems, the present invention has the following configurations.

According to one configuration of the invention, a semiconductor light-emitting device includes a translucent substrate having a first principal surface, a second principal surface and a side surface, wherein the side surface is in contact with the first principal surface and the second principal surface, a semiconductor layer disposed on the first principal surface of the translucent substrate, a first metal layer disposed in contact with the second principal surface of the translucent substrate, a second metal layer disposed in contact with at least the second principal surface or the side surface of the translucent substrate around the first metal layer, and a third metal layer disposed on the second metal layer, the first metal layer having a reflectance with respect to a peak wavelength of light emitted from an emitting layer higher than the reflectance of the second metal layer, the second metal layer having an adhesion with respect to the translucent substrate higher than the adhesion between the first metal layer and the translucent substrate. The second metal layer may be replaced by a dielectric multilayer film.

According to the present invention, it becomes possible to obtain semiconductor light-emitting devices which have a semiconductor layer on a principal surface of a translucent substrate and a metal layer on the other surface opposite to the principal surface having the semiconductor layer, which enables that the peeling of the metal layer from the translucent substrate is suppressed.

BRIEF DESCRIPTION OF THE DRAWINGS

FIG. 1 is a set of schematic views illustrating an example of a structure of a semiconductor light-emitting device according to a first embodiment of the invention, wherein

DETAILED DESCRIPTION OF THE INVENTION

Figure 1A:
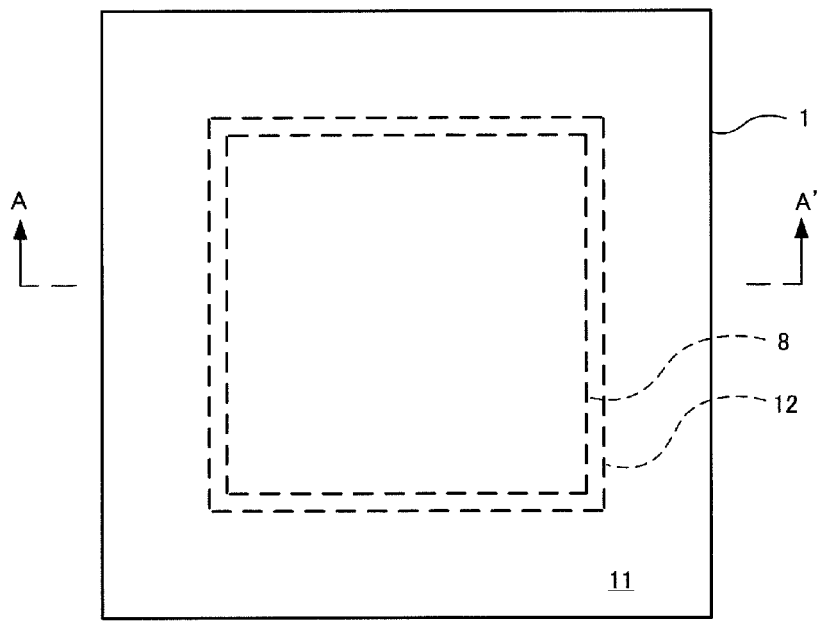
FIG. 1A is a schematic plan view as viewed from the third metal layer side and FIG. 1B is a schematic sectional view along the line A-A' in FIG. 1A.

Semiconductor light-emitting devices 100 according to embodiments of the invention will be described with reference to drawings. The embodiments described below are not restrictive and only illustrate exemplary aspects representing concrete technical ideas of the invention. As long as restrictive descriptions are absent, configurations of components described in the embodiments such as sizes, materials, shapes and relative arrangements are only illustrative and do not intend to limit the scope of the invention to the configurations. For clear explanation, configurations of elements illustrated in the drawings such as sizes and positional relations are sometimes not to scale.

A semiconductor light-emitting device 100 has a translucent substrate 1 and a semiconductor layer 20. The translucent substrate 1 has a first principal surface, a second principal surface and a side surface 1a. The side surface 1a is in contact with the first principal surface and the second principal surface. The semiconductor layer 20 is disposed on the first principal surface of the translucent substrate 1 and is including at least an emitting layer 3. The semiconductor light-emitting device 100 of the invention has a first metal layer 8 as a reflective layer which is disposed in contact with the second principal surface of the translucent substrate 1. Further, the semiconductor light-emitting device 100 of the invention has a second metal layer 9 disposed in contact with at least the second principal surface or the side surface 1a of the translucent substrate 1 around the first metal layer 8.

Figure 4:
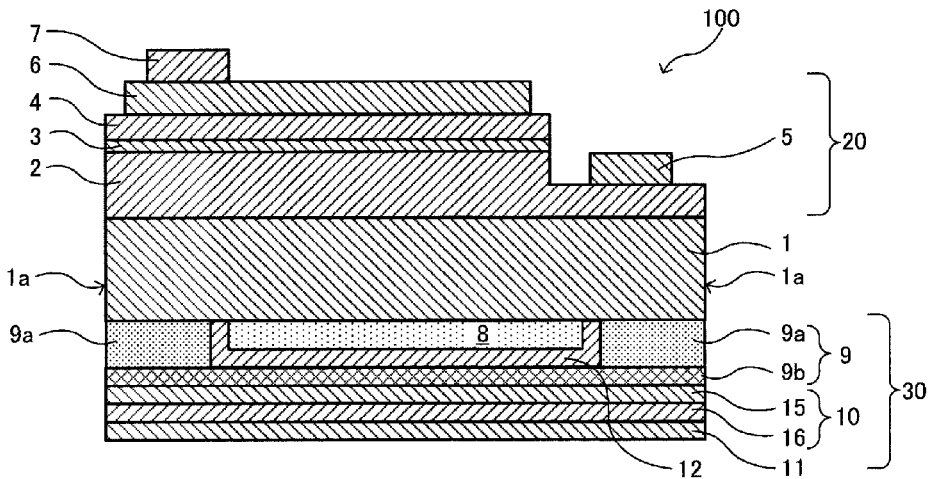
FIG. 4 is a schematic sectional view illustrating an example of a structure of a semiconductor light-emitting device according to a second embodiment of the invention.
Figure 6:
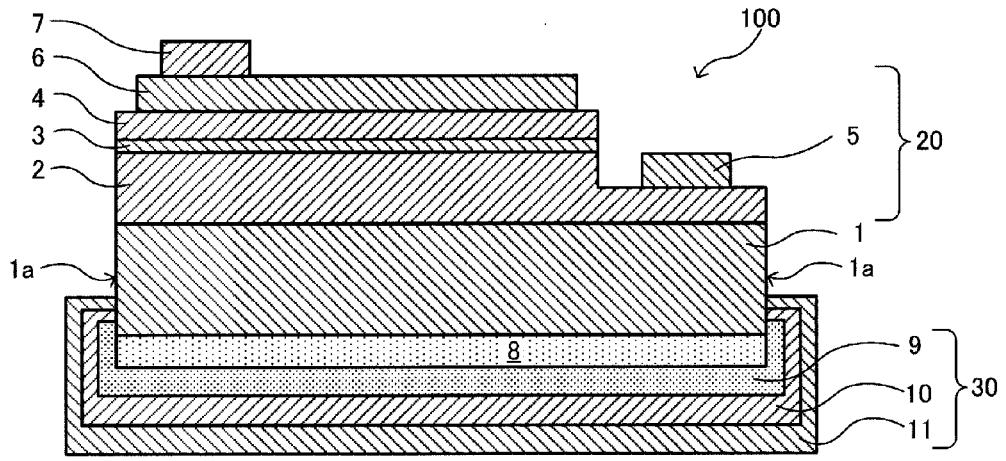
FIG. 6 is a schematic sectional view illustrating an example of a structure of a semiconductor light-emitting device according to a third embodiment of the invention.

The second metal layer 9 is disposed in contact with at least part of the surface of the translucent substrate 1 defined by the second principal surface and the side surface 1a. In an example illustrated in FIG. 1, the second metal layer 9 is illustrated as being disposed in contact with part of the second principal surface. Further, FIG. 4 illustrates an example in which the second metal layer 9 includes an adhesive portion 9a and a cover portion 9b, and the adhesive portion 9a is disposed in contact with part of the second principal surface. Furthermore, FIG. 6 illustrates an example in which the second metal layer 9 is disposed in contact with part of the side surface 1a. In examples illustrated in FIG. 9 and FIG. 10, a dielectric multilayer film 19 is utilized instead of the second metal layer 9. As illustrated in FIG. 1, FIG. 6, FIG. 9 and FIG. 10, the second metal layer 9 and the dielectric multilayer film 19 cover the first metal layer 8 in an enclosing manner while having a partial contact with the second principal surface or the side surface 1a.

Figure 9:
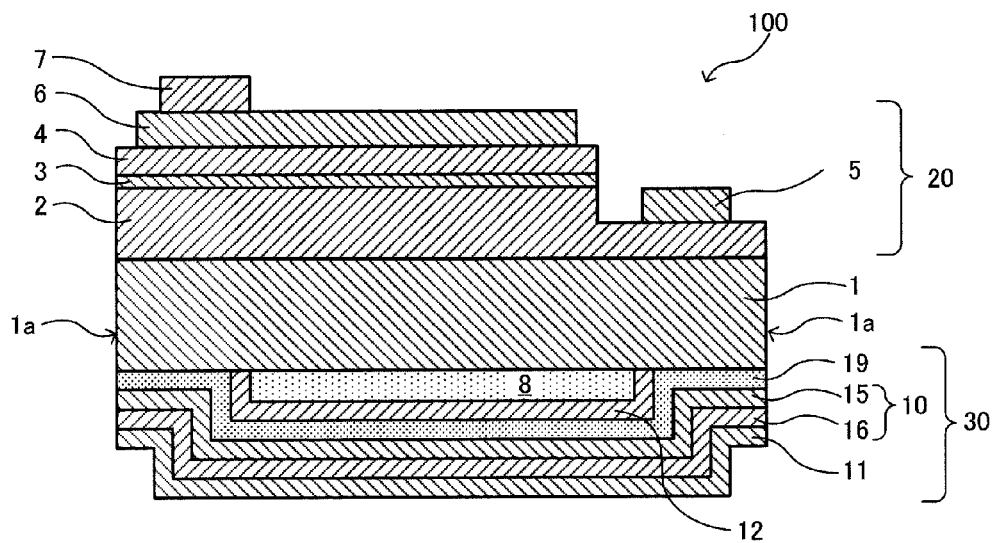
FIG. 9 is a schematic sectional view illustrating an example of a structure of a semiconductor light-emitting device according to a fourth embodiment of the invention.
Figure 10:
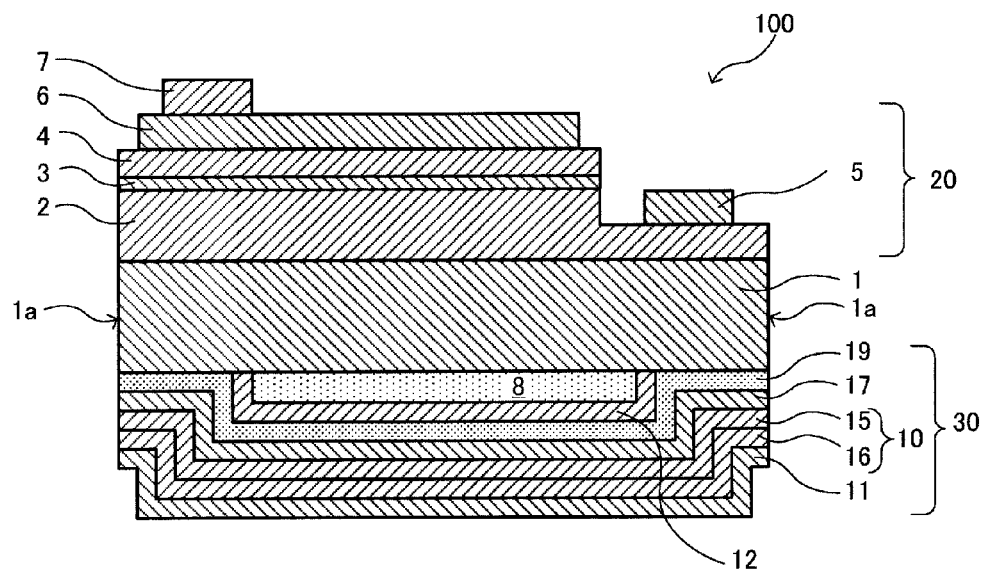
FIG. 10 is a schematic sectional view illustrating another example of a structure of a semiconductor light-emitting device according to the fourth embodiment of the invention.

In the examples illustrated in FIG. 1, FIG. 9 and FIG. 10, the second metal layer 9 or the dielectric multilayer film 19 is disposed in contact with only the second principal surface of the surfaces of the translucent substrate 1. As a result, the adhesion between the second metal layer 9 or the dielectric multilayer film 19 and the translucent substrate 1 can be reliably obtained.

In the semiconductor light-emitting device 100 of the invention, the second metal layer 9 and the dielectric multilayer film 19 have an adhesion with respect to the translucent substrate 1 higher than the adhesion between the first metal layer 8 and the translucent substrate 1. That is, strong bonding is obtained between the second metal layer 9 or the dielectric multilayer film 19, and the translucent substrate 1. Thus, the second metal layer 9 can reinforce the adhesion of the first metal layer 8 with respect to the translucent substrate 1. Consequently, in the inventive semiconductor light-emitting device 100, the first metal layer 8 (a reflective layer) disposed in contact with the second principal surface of the translucent substrate 1 can be suppressed from being separated. Further, the first metal layer 8 has a reflectance with respect to a peak wavelength of light emitted from the emitting layer 3 higher than the reflectance of the second metal layer 9. Thus, the adhesion of the first metal layer 8 with respect to the translucent substrate 1 can be reinforced with the second metal layer 9 while the high reflectance of the first metal layer 8 is maintained.

In the semiconductor light-emitting device 100 of the invention, a third metal layer 11 is disposed on the second metal layer 9 on the side opposite to the first metal layer 8. According to this configuration, the semiconductor light-emitting device 100 can be mounted on a board with high adhesion.

The inventive semiconductor light-emitting devices 100 described above may be semiconductor light-emitting devices 100 having the following configurations A and B.

A semiconductor light-emitting device 100 with the configuration A has a translucent substrate 1 having a first principal surface, a second principal surface and a side surface 1a, wherein the side surface 1a is in contact with the first principal surface and the second principal surface, a semiconductor layer 20 disposed on the first principal surface of the translucent substrate 1, a first metal layer 8 disposed in contact with the second principal surface of the translucent substrate 1, a second metal layer 9 disposed in contact with at least the second principal surface or the side surface 1a of the translucent substrate 1 around the first metal layer 8 and including a material different from that of the first metal layer 8, and a third metal layer 11 disposed on the second metal layer 9.

A semiconductor light-emitting device 100 with the configuration B has a translucent substrate 1 having a first principal surface, a second principal surface and a side surface 1a, wherein the side surface 1a is in contact with the first principal surface and the second principal surface, a semiconductor layer 20 disposed on the first principal surface of the translucent substrate 1, a first metal layer 8 disposed in contact with the second principal surface of the translucent substrate 1, a dielectric multilayer film 19 disposed in contact with at least the second principal surface or the side surface 1a of the translucent substrate 1 around the first metal layer 8, and a third metal layer 11 disposed on the dielectric multilayer film 19.

In the configurations A and B, it is preferable that the second metal layer 9 or the dielectric multilayer film 19 has an adhesion with respect to the translucent substrate 1 higher than the adhesion between the first metal layer 8 and the translucent substrate 1, and that the first metal layer 8 includes a material containing Ag.

Hereinbelow, embodiments of the invention will be described with appropriate reference to the drawings.

First Embodiment

The configuration of a semiconductor light-emitting device 100 according to the first embodiment will be described with reference to FIG. 1.

Figure 1B:
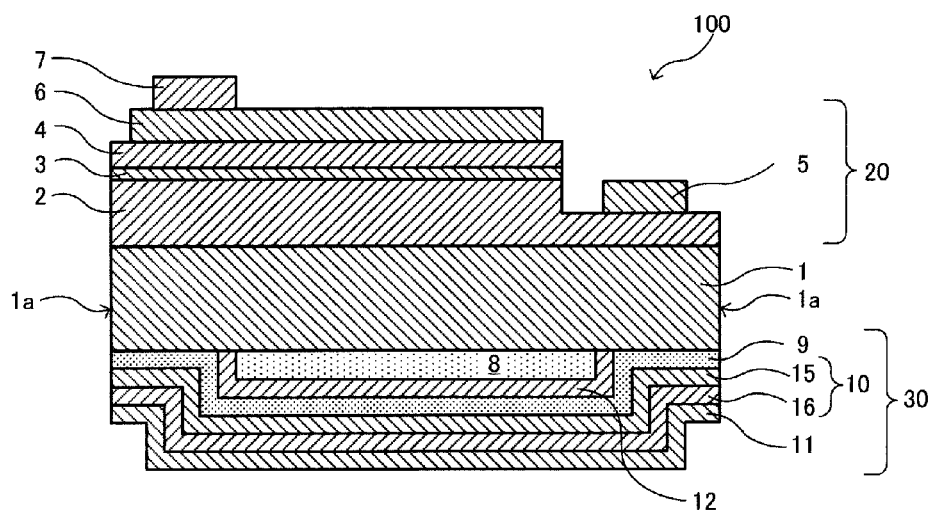

As illustrated in FIG. 1B, the semiconductor light-emitting device 100 of the first embodiment has a translucent substrate 1 and a semiconductor layer 20 including an emitting layer 3 on a principal surface on one side (hereinafter, first principal surface) of the translucent substrate 1. For example, the semiconductor layer 20 is a semiconductor stack in which nitride semiconductor layers, namely, an n-type semiconductor layer 2, the emitting layer 3 and a p-type semiconductor layer 4, are stacked on top of one another. On the surface of the p-type semiconductor layer 4, a p-side full-area electrode 6 and a p-side pad electrode 7 are disposed. Further, a portion of the semiconductor layer 20 has been removed to expose the n-type semiconductor layer 2 and an n-side electrode 5 is disposed on the exposed surface.

On the principal surface on the other side of the translucent substrate 1 (namely, the backside of the first principal surface, hereinafter referred to as second principal surface), a stacked structure 30 is disposed in which a first metal layer 8, a first metal layer-covering layer 12, a second metal layer 9, an intermediate layer 10 and a third metal layer 11 are sequentially stacked on top of one another.

As illustrated in FIGS. 1A and 1B, the first metal layer 8 covers only a central portion of the second principal surface. Further, the first metal layer-covering layer 12 is disposed in contact with the top surface (the surface opposite to the translucent substrate 1) and the side surface of the first metal layer 8 so as to cover these surfaces.

The second metal layer 9 is disposed to cover the top surface (the surface opposite to the translucent substrate 1) and the side surface of the first metal layer-covering layer 12 as well as to cover a part of the second principal surface where the first metal layer 8 and the first metal layer-covering layer 12 do not cover. That is, the second metal layer 9 is disposed to have a partial contact with the second principal surface and to continuously cover the second principal surface and the top surface of the first metal layer 8. As a result, the second metal layer 9 covers the first metal layer 8 in an enclosing manner together with the translucent substrate 1 and can thereby reinforce the adhesion of the first metal layer 8 with respect to the translucent substrate 1.

Because the second metal layer 9 is disposed to continuously cover the second principal surface and the top surface of the first metal layer 8, the adhesion of the first metal layer 8 with respect to the translucent substrate 1 can be reliably reinforced by the second metal layer 9.

In the example illustrated in FIG. 1, the intermediate layer 10 includes two layers, namely, a first intermediate layer 15 and a second intermediate layer 16.

Next, configurations of the components will be described in detail with reference to FIG. 1.

(Translucent Substrate 1)

The translucent substrate 1 is a member as a base for the formation of the semiconductor layer 20. The translucent substrate 1 is made of a material selected from materials which has translucency to at least the wavelength of light emitted from the semiconductor layer 20, for example, materials such as sapphire and SiC.

(Semiconductor Layer 20)

The semiconductor layer 20 includes at least an emitting layer 3. More preferably, a first conductivity-type semiconductor, an emitting layer 3 and a second conductivity-type semiconductor are disposed in this order on the first principal surface of the translucent substrate 1. In this embodiment, the semiconductor layer 20 has a configuration in which an n-type semiconductor layer 2, an emitting layer 3 and a p-type semiconductor layer 4 are stacked sequentially from the translucent substrate 1 side. However, any other configurations may be adopted as long as the configuration permits the semiconductor light-emitting device 100 to function. For example, the first conductivity-type semiconductor may be a p-type semiconductor and the second conductivity-type semiconductor may be an n-type semiconductor.

In an exemplary case described later, the semiconductor layer 20 may be gallium nitride compound semiconductors. In this case, a compound represented by the general formula $In_xAl_yGa_{1-x-y}N$ ($0 \leq x \leq 1$, $0 \leq y \leq 1$, $0 \leq x+y \leq 1$) may be used. In addition to this compound, a compound of the above formula in which the Group III elements are partially replaced by B or in which N as the Group V element is partially replaced by P or As may be used.

(n-Side Electrode 5, p-Side Full-Area Electrode 6 and p-Side Pad Electrode 7)

In the first embodiment, the n-side electrode 5 is disposed in contact with the n-type semiconductor layer 2, and the p-side full-area electrode 6 is disposed in contact with the p-type semiconductor layer 4. The n-side electrode 5 is disposed on the surface of the n-type semiconductor layer 2 exposed by the removal of a portion of the upper layer(s) in the semiconductor layer 20. The n-side electrode 5 is a pad electrode to which a conductive wire made of a material such as Au or Ag is connected for supplying electric current to the semiconductor light-emitting device 100. For example, the n-side electrode 5 is formed by stacking W, Pt and Au sequentially on the exposed surface of the n-type semiconductor layer 2. The materials forming the n-side electrode 5 may be other materials such as stacks of the above metals in combination with other metals, or alloys formed of the above metals or further in combination with other metals as long as the materials can establish an ohmic contact with the n-type semiconductor layer 2.

In the first embodiment, the p-side full-area electrode 6 is disposed on the top surface of the p-type semiconductor layer 4 which is the uppermost layer of the semiconductor stack. The p-side full-area electrode 6 is formed in substantially the entire region of the top surface of the p-type semiconductor layer 4 which corresponds to substantially the entire region of the emitting layer 3. Because the semiconductor light-emitting device 100 in the first embodiment has a configuration that light is mainly emitted from the electrode-arranged side, it is preferable that the p-side full-area electrode 6 has translucency to the wavelength of light emitted from the emitting layer 3. Examples of such materials having both translucency and conductivity include ITO (indium tin oxide), ZnO, metal thin films in which Ni and Au are sequentially stacked on the p-type semiconductor layer 4 in this order, and Ni—Au alloy thin films. The materials forming the p-side full-area electrode 6 may be other materials such as stacks or alloys of a combination with other metals as long as the materials can establish an ohmic contact with the p-type semiconductor layer 4.

The p-side pad electrode 7 is a pad electrode which is disposed on a portion of the surface of the p-side full-area electrode 6 and to which a conductive wire made of a material such as Au or Ag is connected for supplying electric current to the semiconductor light-emitting device 100. Similarly to the n-side electrode 5, the p-side pad electrode 7 may be formed by, for example, stacking materials such as W, Pt and Au.

(Stacked Structure 30 on Second Principal Surface)

In the semiconductor light-emitting device 100 of the first embodiment of the invention, a stacked structure 30 is disposed on the second principal surface of the translucent substrate 1 in which a first metal layer 8, a first metal layer-covering layer 12, a second metal layer 9, an intermediate layer 10 and a third metal layer 11 are sequentially stacked on top of one another.

The first metal layer 8 is a reflective layer for reflecting upward the light which has been emitted from the emitting layer 3 in the semiconductor layer 20 and has been transmitted through the translucent substrate 1. In the example illustrated in FIG. 1, the first metal layer 8 covers only a central portion of the second principal surface of the translucent substrate 1. To improve the light emitting efficiency of the semiconductor light-emitting device 100, the first metal layer 8 preferably covers as much as possible the second principal surface of the translucent substrate 1. However, it is preferable that the first metal layer 8 is not disposed at a periphery of the second principal surface of the translucent substrate 1 to ensure an area required for the second metal layer 9 to achieve sufficient adhesion with respect to the translucent substrate 1.

The first metal layer 8 preferably includes one selected from Ag, Ag alloys, Rh and Pt which are metal materials having high reflectance to the light emitted from the semiconductor layer 20. In particular, Ag is a preferable material for the first metal layer 8 because of the high reflectance of Ag.

In the semiconductor light-emitting device 100 of the first embodiment of the invention, the second metal layer 9 is disposed around the first metal layer 8. Further, the second metal layer 9 is disposed in contact with a portion of the surface of the translucent substrate 1 defined by the second principal surface and the side surface 1a. In the example illustrated in FIG. 1, the second metal layer 9 exhibiting high adhesion to the translucent substrate 1 is disposed in contact with a portion of the second principal surface. The second metal layer 9 can reinforce the adhesion of the first metal layer 8 with respect to the translucent substrate 1 by covering the first metal layer 8 in an enclosing manner while having a partial contact with the second principal surface. Thus, it becomes possible to suppress the peeling of the first metal layer 8 (the reflective layer) disposed in contact with the second principal surface of the translucent substrate 1.

The second metal layer 9 preferably includes a material including Al, Ni, Ti or an Al alloy. The second metal layer 9 made of such a metal material exhibits a high adhesion with respect to the translucent substrate 1 at the region in which the second metal layer 9 is in contact with the surface of the translucent substrate 1. Further, the formation of the second metal layer 9 around the first metal layer 8 can reliably reinforce the adhesion of the first metal layer 8 with respect to the translucent substrate 1.

To prevent the material of the first metal layer 8 from being diffused toward the second metal layer 9, the semiconductor light-emitting device 100 of the invention preferably has a first metal layer-covering layer 12 between the first metal layer 8 and the second metal layer 9. The presence of the first metal layer-covering layer 12 can prevent the diffusion of the material of the first metal layer 8 toward the second metal layer 9 and thus can prevent a decrease in the performance of the first metal layer 8 as the reflective layer.

The first metal layer-covering layer 12 preferably includes Ni. In particular, when Ag is the material of the first metal layer 8, the diffusion of the material of the first metal layer 8 toward the second metal layer 9 can be reliably prevented by forming the first metal layer-covering layer 12 from a material including Ni.

The semiconductor light-emitting device 100 of the invention has a third metal layer 11 disposed on the top surface of the second metal layer 9 opposite to the first metal layer 8. In the example illustrated in FIG. 1, the third metal layer 11 is disposed on the top surface of an intermediate layer 10 or as the uppermost surface above the second principal surface of the translucent substrate 1 (in FIG. 1B, as the lowermost portion of the semiconductor light-emitting device 100). The third metal layer 11 functions as an adhesive for mounting the semiconductor light-emitting device 100 onto a board, which is not shown. A material such as Au—Sn or Pd—Sn may be used as the third metal layer 11. Au—Sn having a low melting point and good stability is preferably used.

To prevent the material of the third metal layer 11 from being diffused into the first metal layer 8, the semiconductor light-emitting device 100 of the invention preferably has an intermediate layer 10 between the second metal layer 9 and the third metal layer 11. The intermediate layer 10 between the second metal layer 9 and the third metal layer 11 prevents the diffusion or migration of the material of the third metal layer 11 into the first metal layer 8 (the reflective layer). Thus, the first metal layer 8 is prevented from being discolored by the material of the third metal layer 11 and can reflect the light from the emitting layer 3 with good efficiency.

To reliably prevent the diffusion of the material of the third metal layer 11 into the first metal layer 8, the intermediate layer 10 may include one or both of a second intermediate layer 16 disposed in contact with the third metal layer 11 and a first intermediate layer 15 disposed between the second intermediate layer 16 and the second metal layer 9.

The first intermediate layer 15 preferably includes a material including one selected from Ti, W and alloys thereof. The first intermediate layer 15 made of such a material can reliably suppress the diffusion of the material of the third metal layer 11 into the second metal layer 9 and the first metal layer 8.

The second intermediate layer 16 preferably includes a material including one selected from Pt, Rh and alloys thereof. The second intermediate layer 16 sometimes is mixed with the third metal layer 11 made of, for example, Au. However, the formation of the second intermediate layer 16 in contact with the third metal layer 11 can prevent the material of the third metal layer 11 from migrating through the second intermediate layer 16 into the second metal layer 9 and the first metal layer 8 disposed on the translucent substrate 1.

In the case where the semiconductor layer 20 includes nitride semiconductors emitting short-wavelength light such as, in particular, blue light and the third metal layer 11 is an adhesive material including Au, a critical problem is caused if Au is precipitated on the translucent substrate 1 side of the first metal layer 8. That is, because Au has high absorbance with respect to short-wavelength lights such as blue light, the precipitation of Au on the translucent substrate 1 side of the first metal layer 8 results in a decrease in the reflectance of the first metal layer 8 and also greatly affects light distribution characteristics. When the inventive semiconductor light-emitting device 100 has the specific second intermediate layer 16, the adverse effects on the reflectance of the first metal layer 8 and the light distribution characteristics can be prevented.

Because the first metal layer 8 and the second metal layer 9 are disposed in contact with the second principal surface of the translucent substrate 1, the light traveling from the semiconductor layer 20 toward the second principal surface through the translucent substrate 1 can be reflected toward the first principal surface and be emitted to the outside of the semiconductor light-emitting device 100. In order to make the first metal layer 8 with high reflectance efficiently reflect the light emitted from the emitting layer 3 in the semiconductor layer 20, it is preferable that the first metal layer 8 be disposed at a position opposed to at least the emitting layer 3.

(Manufacturing Method)

A method for manufacturing the semiconductor light-emitting devices 100 of the first embodiment of the invention will be described with reference to FIG. 1 and FIG. 2. In the first embodiment, the steps are carried out while the semiconductor light-emitting devices 100 illustrated in FIG. 1 are arranged two-dimensionally as a wafer, and the wafer is divided into chips as the semiconductor light-emitting devices 100.

The steps for manufacturing the semiconductor light-emitting devices 100 of the first embodiment include a step of forming a semiconductor layer 20 on the first principal surface of a translucent substrate 1, a step of forming a stacked structure 30 including a first metal layer 8 on the second principal surface of the translucent substrate 1, and a step of dividing the wafer into chips as the semiconductor light-emitting devices 100. The method for manufacturing the semiconductor light-emitting devices 100 of the present invention is characterized in that the step of forming a stacked structure 30 including a first metal layer 8 on the second principal surface of the translucent substrate 1 includes a first metal layer formation step in which a first metal layer 8 is formed in contact with the second principal surface of the translucent substrate 1 having a prescribed semiconductor layer 20, and a second metal layer formation step in which a second metal layer 9 is formed such that the second metal layer 9 covers the first metal layer 8 and is in contact with a portion of the surface defined by the second principal surface and a side surface 1a of the translucent substrate 1. The individual steps will be described sequentially below.

(Step of Forming Semiconductor Layer 20 on First Principal Surface)

The step of forming a semiconductor layer 20 includes a step of forming a semiconductor layer 20 which is a semiconductor stack on the first principal surface of the translucent substrate 1, and a step of forming electrodes on the semiconductor layer 20.

(Step of Forming Semiconductor Layer 20)

First, a semiconductor layer 20 is formed by sequentially stacking an n-type semiconductor layer 2 made of Si-doped GaN, an emitting layer 3 made of InGaN, and a p-type semiconductor layer 4 made of Mg-doped GaN by a method such as MOCVD, on the first principal surface of the translucent substrate 1 with an under layer on the first principal surface.

The semiconductor layer 20, in particular the nitride semiconductor layers, may be grown by any method without limitation. Known methods for growing semiconductors such as nitride semiconductors may be used. The examples of the known methods are MOVPE (metal organic vapor phase epitaxy), MOCVD (metal organic chemical vapor deposition), HVPE (hydride vapor phase epitaxy) and MBE (molecular beam epitaxy). In particular, MOCVD is preferable because high quality crystalline semiconductors can be grown.

(Step of Forming Electrodes on Semiconductor Layer 20)

First, a recess for the formation of an n-side electrode 5 is formed by removing a portion of the semiconductor layer 20 by a method such as etching to expose the n-type semiconductor layer 2. Next, the n-side electrode 5 is formed on the bottom surface of the recess, namely, the exposed surface of the n-type semiconductor layer 2. Further, a p-side full-area electrode 6 is formed on the p-type semiconductor layer 4, and a p-side pad electrode 7 is formed on a portion of the p-side full-area electrode 6.

The electrodes may be formed by known methods such as vapor deposition and sputtering. For example, W, Pt and Au may be sequentially stacked on the n-type semiconductor layer 2 to form the n-side electrode 5; an ITO film may be formed as the p-side full-area electrode 6; and W, Pt and Au may be stacked to form the p-side pad electrode 7. The electrodes of the semiconductor layer 20 in the first embodiment may be obtained by patterning these stacks and films in respective desired shapes. When the p-side pad electrode 7 and the n-side electrode 5 are made of the same material, the p-side pad electrode 7 and the n-side electrode 5 may be formed in the same step.

(Step of Forming Stacked Structure 30 Including First Metal Layer 8 on Second Principal Surface)

After the semiconductor layer 20 is formed on the first principal surface, a stacked structure 30 including a first metal layer 8 is formed on the second principal surface which is the backside of the first principal surface.

Figure 2A:
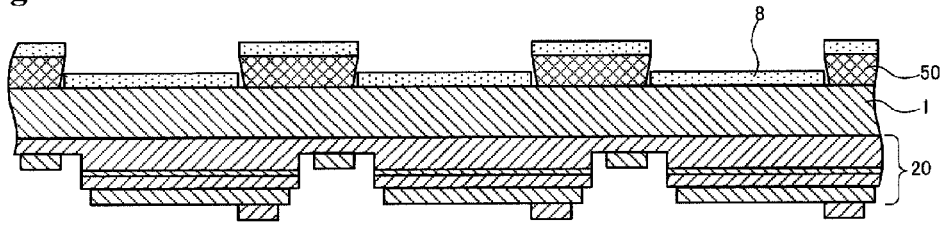
FIGS. 2A to 2F are a set of schematic sectional views illustrating an example of steps for manufacturing semiconductor light-emitting devices according to the first embodiment of the invention.
Figure 2B:
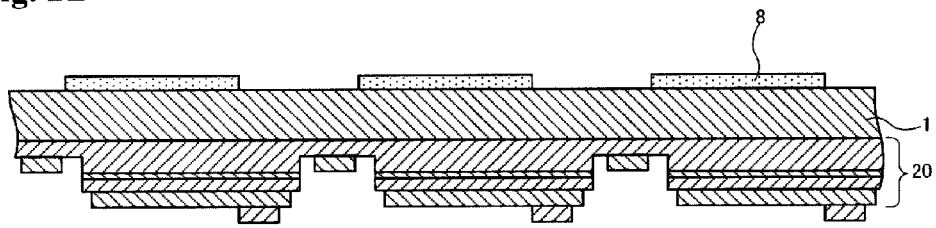

The step of forming a stacked structure 30 including a first metal layer 8 starts with a first metal layer formation step. In the first metal layer formation step, a mask pattern of a resist film 50 is formed by a photolithographic process on a region of the second principal surface, which includes a region in which a second metal layer 9 is to be formed and a region serving as a cut section during dicing. Next, a prescribed material is applied to the entire surface of the second principal surface of the translucent substrate 1 by a film-forming method selected from, for example, sputtering and deposition, thereby forming a first metal layer 8 (FIG. 2A). After the film formation, the resist film 50 is removed and the first metal layer 8 with the desired shape is formed (FIG. 2B).

Figure 2C:
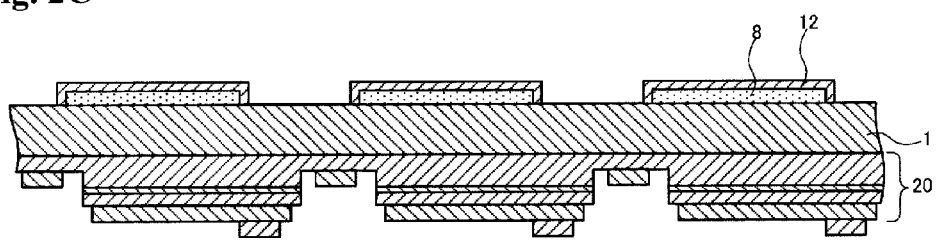

Next, a first metal layer-covering layer 12 is formed to cover the first metal layer 8 by the same procedures as the formation of the first metal layer 8. In detail, a mask pattern of a resist film 50 is formed by a photolithographic process on a region of the second principal surface, which includes a region in which a second metal layer 9 is to be formed and a region serving as a cut section during dicing. Next, a prescribed material is applied to the entire surface of the second principal surface of the translucent substrate 1 by a method such as sputtering or vapor deposition, thereby forming a first metal layer-covering layer 12. After the film formation, the resist film 50 is removed and the first metal layer-covering layer 12 with the desired shape is formed (FIG. 2C).

Figure 2D:
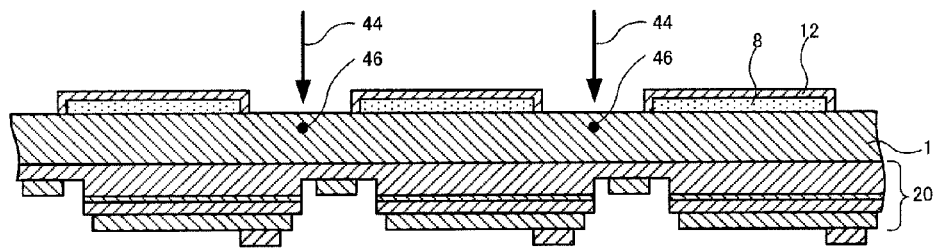

Next, a laser beam 44 is applied to the translucent substrate 1 and is focused to a focal point 46 which serves as a cut section during dicing (FIG. 2D). Examples of the laser beams 44 include femtosecond laser beams. This step performs only the application of the laser beam 44 and does not include dicing of the wafer into chips.

Figure 2E:
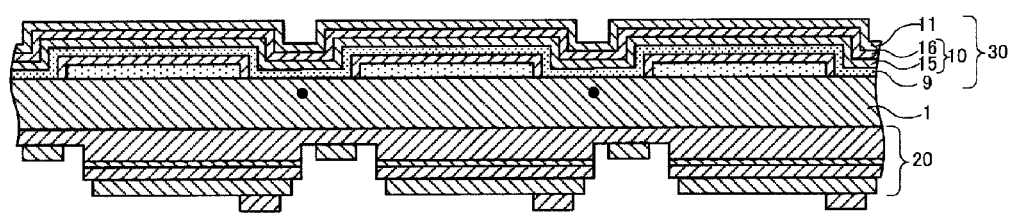
Figure 2F:
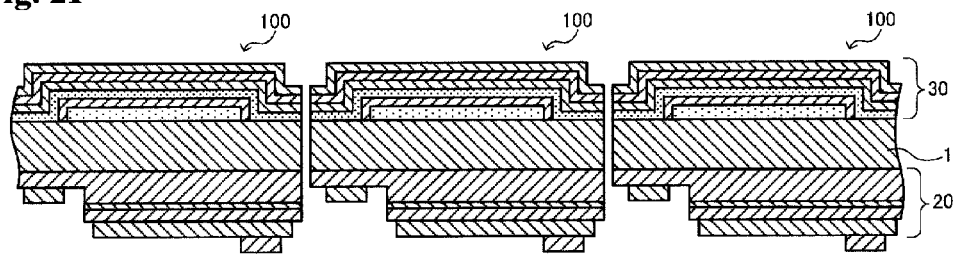

Next, a second metal layer formation step is performed in which a prescribed material is applied to the entirety of the second principal surface including the region serving as a cut section during dicing and the region in which the layers such as the first metal layer 8 are disposed, by a method such as sputtering, thereby stacking a second metal layer 9 (FIG. 2E). In this step, the second metal layer 9 is formed in contact with the second principal surface of the translucent substrate 1 at the outside of the outer periphery of the first metal layer 8 and the first metal layer-covering layer 12. As a result, the second metal layer 9 covers the first metal layer 8 and the first metal layer-covering layer 12 in an enclosing manner.

Next, an intermediate layer 10 is formed to cover the second metal layer 9 by a method such as sputtering or vapor deposition. When the intermediate layer 10 is a multilayer film, for example, a prescribed first intermediate layer 15 and a prescribed second intermediate layer 16 described above may be stacked sequentially by the application of different materials to form the intermediate layer 10 covering the second metal layer 9 (FIG. 2E).

Further, a prescribed material is applied by a method such as sputtering or vapor deposition to stack a third metal layer 11 (FIG. 2E).

By the above procedures, the semiconductor light-emitting devices 100 of the first embodiment including the region which serves as a cut section during dicing are produced (FIG. 2E).

Next, simplified steps for the formation of the first metal layer 8 and the first metal layer-covering layer 12 will be described with reference to FIG. 3.

Figure 3A:
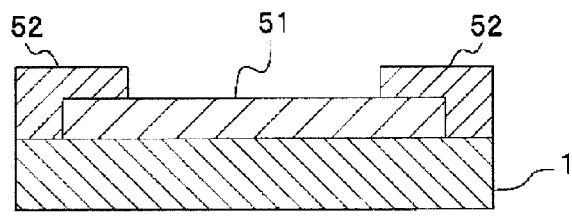
FIGS. 3A to 3D are a set of schematic sectional views illustrating a modified example of steps for forming a first metal layer and a first metal layer-covering layer in a method for manufacturing semiconductor light-emitting devices according to the first embodiment of the invention.

First, as illustrated in FIG. 3A, a mask pattern is formed on the second principal surface of the translucent substrate 1. This mask pattern is composed of a first resist 51 and a second resist 52 of different photoresist materials. For example, the first resist 51 may be a photoresist soluble in organic solvents, and the second resist 52 may be a photoresist soluble in aqueous alkaline solutions.

Figure 3B:
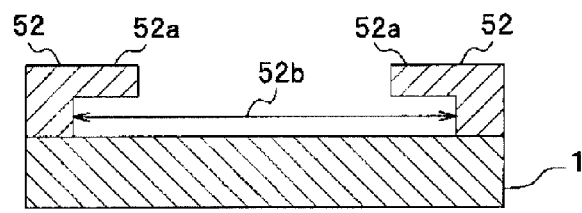

Next, as illustrated in FIG. 3B, the first resist 51 is removed with an organic solvent, thus leaving a mask pattern of the second resist 52 which has an overhang 52a formed by the tapering of an opening 52b.

Figure 3C:
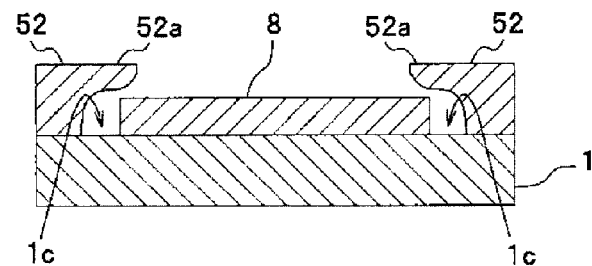

Next, as illustrated in FIG. 3C, a reflective material such as Al is sputtered while using the second resist 52 with the overhang 52a as a mask. In this manner, the first metal layer 8 is formed on the translucent substrate 1 while a portion of the overhang 52a of the second resist 52 is removed. During this process, the overhang 52a limits the extension of the first metal layer 8. Consequently, the first metal layer 8 is formed while an exposed surface 1c of the translucent substrate 1 remains exposed.

Figure 3D:
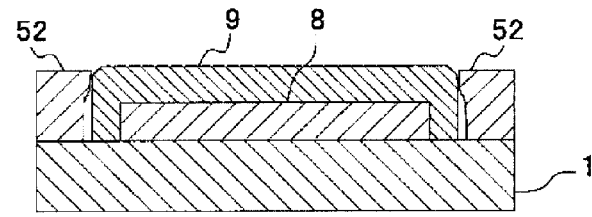

Next, as illustrated in FIG. 3D, a material for the first metal layer-covering layer 12 is sputtered. By this process, the first metal layer-covering layer 12 of an insulating material is stacked on the top surface of the first metal layer 8 as well as on the exposed surface of the translucent substrate 1 while the overhang 52a of the second resist 52 is further removed. As a result, the first metal layer-covering layer 12 can be formed which covers the top surface and the side surface of the first metal layer 8. In the manner described above, the first metal layer 8 and the first metal layer-covering layer 12 can be formed through the simplified steps.

(Step of Dividing Wafer into Chips as Semiconductor Light-Emitting Devices 100)

The description of the method is continued with reference back to FIG. 1 and FIG. 2. After the semiconductor layer 20 is formed on the first principal surface of the translucent substrate 1 and the stacked structure 30 is formed on the second principal surface which includes the first metal layer 8, the first metal layer-covering layer 12, the second metal layer 9, the intermediate layer 10 and the third metal layer 11, the cut section which has been irradiated with the laser beam 44 is cut to divide the wafer into individual chips as the semiconductor light-emitting devices 100.

The semiconductor light-emitting devices 100 of the first embodiment illustrated in FIG. 1 may be manufactured by the aforementioned manufacturing method. The above description only presents a sequential illustration of an example of the steps for manufacturing the inventive semiconductor light-emitting devices 100, and the scope of the invention is not limited to the illustrated example.

Second Embodiment

The configuration of a semiconductor light-emitting device 100 according to the second embodiment of the invention will be described with reference to FIG. 4. As illustrated in FIG. 4 as an example, the semiconductor light-emitting device 100 of the second embodiment is different from the semiconductor light-emitting device 100 of the first embodiment illustrated in FIG. 1 in that the second metal layer 9 includes two portions: an adhesive portion 9a and a cover portion 9b.

The configuration of the semiconductor light-emitting device 100 according to the second embodiment will be described with reference to FIG. 4. Components common to the semiconductor light-emitting device 100 in the first embodiment shown in FIG. 1 will be assigned with the same reference numbers, and the explanation of such components will be omitted arbitrarily.

As illustrated in FIG. 4, the semiconductor light-emitting device 100 of the second embodiment includes a translucent substrate 1 and a semiconductor layer 20 including an emitting layer 3 on a principal surface on one side (a first principal surface) of the translucent substrate 1. The translucent substrate 1 and the semiconductor layer 20 may be similar to the translucent substrate 1 and the semiconductor layer 20 in the first embodiment.

In the semiconductor light-emitting device 100 of the second embodiment of the invention, a stacked structure 30 in which a first metal layer 8, a first metal layer-covering layer 12, a second metal layer 9, an intermediate layer 10 and a third metal layer 11 are sequentially stacked on top of one another is disposed on the principal surface on the other side (the second principal surface) of the translucent substrate 1. The first metal layer 8, the first metal layer-covering layer 12, the intermediate layer 10 and the third metal layer 11 in the second embodiment may be similar to those in the stacked structure 30 in the first embodiment. In the semiconductor light-emitting device 100 of the second embodiment, the second metal layer 9 is different from that in the first embodiment as described below.

In the semiconductor light-emitting device 100 of the second embodiment of the invention, the second metal layer 9 includes an adhesive portion 9a disposed in contact with only a portion of the second principal surface, and a cover portion 9b disposed in contact with the entire top surface of the first metal layer 8. That is, the second metal layer 9 including the adhesive portion 9a and the cover portion 9b is disposed to continuously cover the second principal surface and the top surface of the first metal layer 8. The adhesive portion 9a and the cover portion 9b may be made of the same or different materials. In particular, the adhesive portion 9a and the cover portion 9b are preferably made of different materials because the freedom in the choice of materials can be increased.

In the semiconductor light-emitting device 100 of the second embodiment of the invention, the adhesive portion 9a of the second metal layer 9 is disposed in contact with a portion of the second principal surface. The adhesive portion 9a preferably includes a material including Al, Ni, Ti, an Al alloy or a Ag alloy. The adhesive portion 9a made of such a metal material exhibits a high adhesion with respect to the translucent substrate 1 in the region at which the adhesive portion 9*a* is in contact with the surface of the translucent substrate 1. When the translucent substrate 1 is a sapphire substrate, the adhesive portion 9*a* is preferably made of a material exhibiting a good adhesion with the sapphire substrate, for example, a material selected from such as Al and Ag alloys.

In the semiconductor light-emitting device 100 of the second embodiment of the invention, the cover portion 9*b* of the second metal layer 9 is disposed to cover the top surface of the first metal layer 8 opposite to the translucent substrate 1 as well as disposed to be in contact with the entire top surface of the adhesive portion 9*a* opposite to the translucent substrate 1. Similarly to the second metal layer 9 in the first embodiment, the cover portion 9*b* preferably includes a material including Al, Ni, Ti or an Al alloy. The adhesive portion 9*a* and the cover portion 9*b* may be made of the same or different materials. Thus, the freedom in the choice of materials for the second metal layer 9 can be increased in the semiconductor light-emitting device 100 of the second embodiment of the invention.

When the cover portion 9*b* and the adhesive portion 9*a* are each made of the above material, high adhesion can be obtained between the cover portion 9*b* and the adhesive portion 9*a*. As a result, the adhesive portion 9*a* of the second metal layer 9 covers the first metal layer 8 in an enclosing manner together with the cover portion 9*b* of the second metal layer 9 while the adhesive portion 9*a* has a partial contact with the second principal surface. Consequently, the adhesion of the first metal layer 8 with respect to the translucent substrate 1 can be reinforced, and it becomes possible to suppress the peeling of the first metal layer 8 (the reflective layer) disposed in contact with the second principal surface of the translucent substrate 1.

The semiconductor light-emitting device 100 of the second embodiment of the invention having the above structure may be operated similarly to the semiconductor light-emitting device 100 of the first embodiment. Thus, the light emitted from the emitting layer 3 in various directions can be emitted to the outside of the semiconductor light-emitting device 100 through the p-side full-area electrode 6.

(Manufacturing Method)

A method for manufacturing the semiconductor light-emitting devices 100 of the second embodiment of the invention will be described with reference to FIG. 4 and FIG. 5. In the second embodiment, the steps are carried out while the semiconductor light-emitting devices 100 illustrated in FIG. 4 are arranged two-dimensionally as a wafer, and the wafer is divided into chips as the semiconductor light-emitting devices 100.

(Step of Forming Semiconductor Layer 20 on First Principal Surface)

The manufacturing method includes a step of forming a semiconductor layer 20. This step includes a step of forming a semiconductor layer 20 on the first principal surface of a translucent substrate 1, and a step of forming electrodes on the semiconductor layer 20. The semiconductor layer 20 and the electrodes thereon may be formed by the same methods as described in the manufacturing method of the first embodiment.

(Step of Forming Stacked Structure 30 Including First Metal Layer 8 on Second Principal Surface)

After the semiconductor layer 20 is formed on the first principal surface, a stacked structure 30 including a first metal layer 8 is formed on the second principal surface which is the backside of the first principal surface. The first metal layer 8 and the first metal layer-covering layer 12 may be formed by the same methods as described in the manufacturing method of the first embodiment.

Figure 5A:
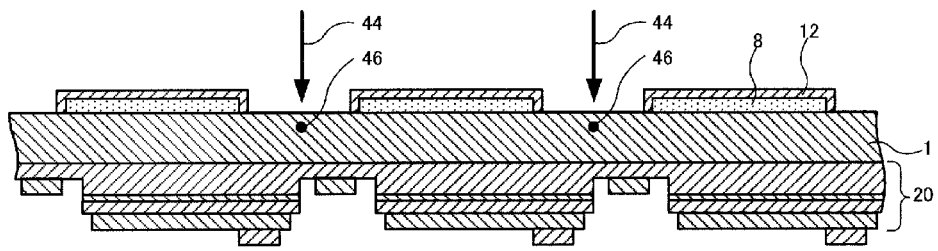
FIGS. 5A to 5C are a set of schematic sectional views illustrating an example of steps for manufacturing semiconductor light-emitting devices according to the second embodiment of the invention.

Next, similarly to the manufacturing method in the first embodiment, a laser beam 44 is applied to the translucent substrate 1 and is focused to a focal point 46 which serves as a cut section during dicing (FIG. 5A). This step performs only the application of the laser beam 44 and does not include dicing of the wafer into chips.

Figure 5B:
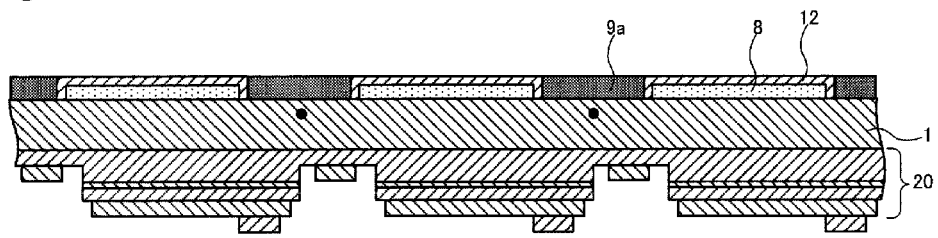

Next, a prescribed material is applied to the second principal surface including the region serving as a cut section during dicing and excluding the region in which the first metal layer 8 and the first metal layer-covering layer 12 are disposed, by a method such as sputtering, thereby stacking an adhesive portion 9*a* of a second metal layer 9 (FIG. 5B). In this step, a resist film 50 is formed on the surface of the first metal layer 8 and the first metal layer-covering layer 12, and the resist film 50 is peeled after the formation of the adhesive portion 9*a*. In this manner, the formation of the adhesive portion 9*a* on the surface of the first metal layer 8 and the first metal layer-covering layer 12 can be avoided.

Figure 5C:
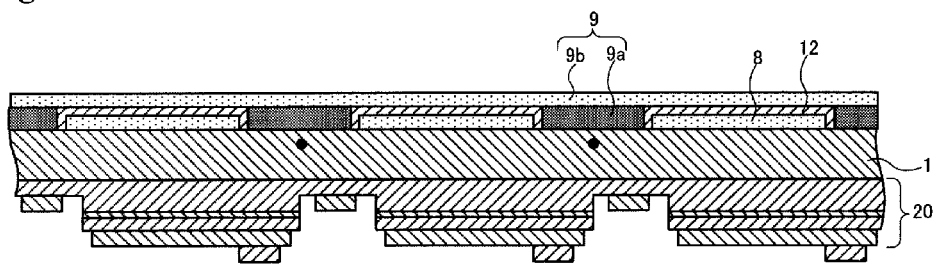

Next, a prescribed material is applied to the entirety of the second principal surface including the region serving as a cut section during dicing and the region in which the layers such as the first metal layer 8 are disposed, by a method such as sputtering, thereby stacking a cover portion 9*b* of the second metal layer 9 (FIG. 5C). As a result, the second metal layer 9 including the adhesive portion 9*a* and the cover portion 9*b* covers the first metal layer 8 and the first metal layer-covering layer 12 in an enclosing manner.

Next, an intermediate layer 10 and a third metal layer 11 are formed by a method such as sputtering or vapor deposition similarly to the manufacturing method of the first embodiment.

By the above procedures, the semiconductor light-emitting devices 100 of the second embodiment including the region which serves as a cut section during dicing are produced. In the semiconductor light-emitting devices 100, the semiconductor layer 20 is disposed on the first principal surface of the translucent substrate 1 and the stacked structure 30 is disposed on the second principal surface which includes the first metal layer 8, the first metal layer-covering layer 12, the second metal layer 9 (the adhesive portion 9*a* and the cover portion 9*b*), the intermediate layer 10 and the third metal layer 11. Similarly to the manufacturing method of the first embodiment, the cut section which has been irradiated with the laser beam 44 is cut to divide the wafer into individual chips as the semiconductor light-emitting devices 100.

The semiconductor light-emitting devices 100 of the second embodiment illustrated in FIG. 4 may be manufactured by the aforementioned manufacturing method.

Third Embodiment

The configuration of a semiconductor light-emitting device 100 according to the third embodiment of the invention will be described with reference to FIG. 6. As illustrated in FIG. 6 as an example, the semiconductor light-emitting device 100 of the third embodiment is different from the semiconductor light-emitting device 100 of the first embodiment illustrated in FIG. 1 in that the first metal layer 8 is disposed on the entirety of the second principal surface and the second metal layer 9 is disposed in contact with the side surface 1*a*.

The configuration of the semiconductor light-emitting device 100 according to the third embodiment will be described with reference to FIG. 6. Components common to the semiconductor light-emitting device 100 in the first embodiment shown in FIG. 1 will be assigned with the same reference numbers, and the explanation of such components will be omitted arbitrarily.

As illustrated in FIG. 6, the semiconductor light-emitting device 100 of the third embodiment includes a translucent substrate 1 having translucent properties and a semiconductor layer 20 including an emitting layer 3 on a principal surface on one side (a first principal surface) of the translucent substrate 1. The translucent substrate 1 and the semiconductor layer 20 may be similar to the translucent substrate 1 and the semiconductor layer 20 in the first embodiment.

In the semiconductor light-emitting device 100 of the third embodiment of the invention, a first metal layer 8 is stacked on the entirety of the principal surface on the other side (the second principal surface) of the translucent substrate 1, and a stacked structure 30 is disposed thereon in which a second metal layer 9, an intermediate layer 10 and a third metal layer 11 are sequentially stacked on top of one another on the entirety of the second principal surface while extending to a side surface 1a.

In the third embodiment of the invention, the first metal layer 8 is disposed on the entirety of the second principal surface. As a result of the first metal layer 8 with high reflectance directly covering the entirety of the second principal surface of the translucent substrate 1, the light emitted from the emitting layer 3 in the semiconductor layer 20 and traveling through the translucent substrate 1 can be reflected upward with higher efficiency. The materials for the first metal layer 8 may be similar to the materials in the first embodiment.

In the semiconductor light-emitting device 100 of the third embodiment of the invention, the second metal layer 9 is disposed around the first metal layer 8 and in contact with the side surface 1a. In the example illustrated in FIG. 6, the second metal layer 9 exhibiting high adhesion with respect to the translucent substrate 1 is disposed around the first metal layer 8 while being in contact with the top surface thereof and further extends to a portion of the side surface 1a. Because the second metal layer 9 covers the first metal layer 8 in an enclosing manner while having a partial contact with the side surface 1a, the adhesion of the first metal layer 8 with respect to the translucent substrate 1 can be reinforced. Thus, it becomes possible to suppress the peeling of the first metal layer 8 (the reflective layer) disposed in contact with the second principal surface of the translucent substrate 1.

The second metal layer 9 preferably includes a material including Al, Ni, Ti or an Al alloy. The second metal layer 9 made of such a metal material exhibits a high adhesion with respect to the translucent substrate 1 at the region in which the second metal layer 9 is in contact with the surface of the translucent substrate 1. To prevent the diffusion of the material of the first metal layer 8 toward the second metal layer 9, the second metal layer 9 is more preferably made of Ni.

In the semiconductor light-emitting device 100 of the third embodiment of the invention, an intermediate layer 10 is further stacked on the entirety of the second principal surface to cover the second metal layer 9. The intermediate layer 10 is disposed to extend to the side surface 1a, whereby the diffusion of the material of a third metal layer 11 into the first metal layer 8 can be prevented. The materials of the intermediate layer 10 may be similar to the materials for the second intermediate layer 16 in the first embodiment. To ensure that the material of a third metal layer 11 be prevented from being diffused into the first metal layer 8, the intermediate layer 10 in the third embodiment is preferably made of Rh.

In the semiconductor light-emitting device 100 of the third embodiment of the invention, a third metal layer 11 is further stacked on the entirety of the second principal surface to cover the intermediate layer 10. The intermediate layer 10 and the third metal layer 11 may be disposed to extend to the side surface 1a. The materials and the functions of the third metal layer 11 in the third embodiment are the same as in the first embodiment.

The semiconductor light-emitting device 100 of the third embodiment of the invention having the above structure may be operated similarly to the semiconductor light-emitting device 100 of the first embodiment. Thus, the light emitted from the emitting layer 3 in various directions can be emitted to the outside of the semiconductor light-emitting device 100 through the p-side full-area electrode 6.

(Manufacturing Method)

A method for manufacturing the semiconductor light-emitting devices 100 of the third embodiment of the invention will be described with reference to FIG. 6, FIG. 7 and FIG. 8. The manufacturing method of the third embodiment may be exemplified by a first example illustrated in FIG. 7 and a second example illustrated in FIG. 8.

(First Example of Manufacturing Method in Third Embodiment)

The first example of the method for manufacturing the semiconductor light-emitting devices 100 of the third embodiment of the invention will be described with reference to FIG. 7. In the first example of the method for manufacturing the semiconductor light-emitting devices 100 of the third embodiment of the invention, the method includes a step of forming a semiconductor layer 20. This step includes a step of forming a semiconductor layer 20 on the first principal surface of a translucent substrate 1, and a step of forming electrodes on the semiconductor layer 20. The semiconductor layer 20 and the electrodes thereon may be formed by the same methods as described in the manufacturing method of the first embodiment.

Figure 7A:
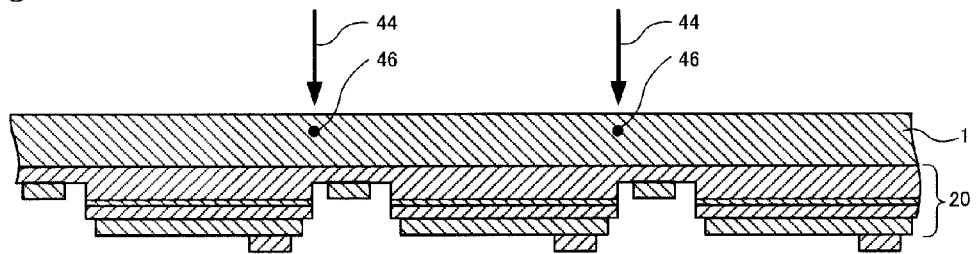
FIGS. 7A to 7C are a set of schematic sectional views illustrating an example of steps for manufacturing semiconductor light-emitting devices according to the third embodiment of the invention.
Figure 7B:
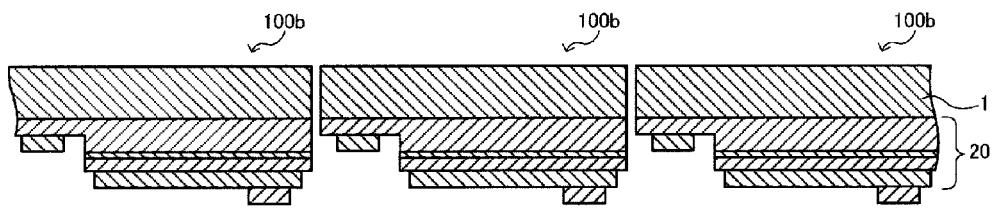

In the first example of the manufacturing method of the third embodiment, a laser beam 44 is next applied to the translucent substrate 1 and is focused to a focal point 46 which serves as a cut section during dicing (FIG. 7A). The cut section irradiated with the laser beam 44 is cut to divide the wafer into individual chips as semiconductor light-emitting devices 100b which are precursors of the semiconductor light-emitting devices 100 before the formation of stacked structure 30 (FIG. 7B). The wafer may be irradiated with the laser beam 44 and divided into chips by the same methods as in the manufacturing method of the first embodiment.

Next, a stacked structure 30 including a first metal layer 8 is formed on the second principal surface which is the backside of the semiconductor light-emitting devices 100b in the form of chips.

In the step of forming the stacked structure 30 including the first metal layer 8, a prescribed material is first applied to the entirety of the second principal surface of the translucent substrate 1 in the form of chips, by a method such as sputtering or vapor deposition to form a film as the first metal layer 8. The first metal layer 8 may be formed before the wafer is divided into chips as the semiconductor light-emitting devices 100b, and the wafer may be divided into chips as the semiconductor light-emitting devices 100b after the formation of the first metal layer 8.

Next, a second metal layer 9 is stacked on the entirety of the second principal surface on which the first metal layer 8 and optionally other layers are disposed, by the application of a prescribed material by a method such as sputtering. Because the translucent substrate 1 is in the form of chips, the second metal layer 9 may be formed in such a manner that the prescribed material for the second metal layer 9 penetrates and extends to the side surface 1a. As a result, the second metal layer 9 is disposed around the first metal layer 8 and in contact with the side surface 1a.

Figure 7C:
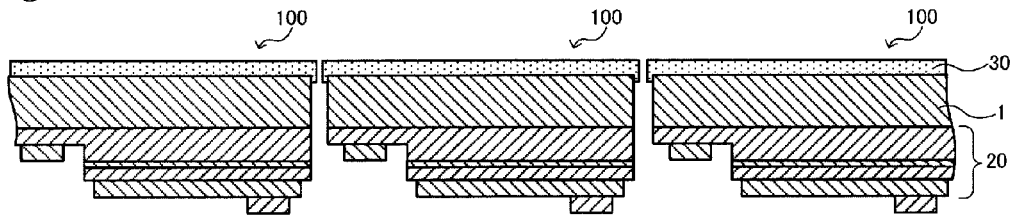

Next, an intermediate layer 10 and a third metal layer 11 are formed by a method such as sputtering or vapor deposition similarly to the second metal layer 9. In this manner, a stacked structure 30 can be formed on the second principal surface of the translucent substrate 1 in the form of chips (FIG. 7C).

The semiconductor light-emitting devices 100 of the third embodiment illustrated in FIG. 6 may be manufactured by the first example of the manufacturing method of the third embodiment described above.

(Second Example of Manufacturing Method in Third Embodiment)

Alternatively, the semiconductor light-emitting devices 100 of the third embodiment may be manufactured by the second example of the manufacturing method as illustrated in FIG. 8.

Figure 8A:
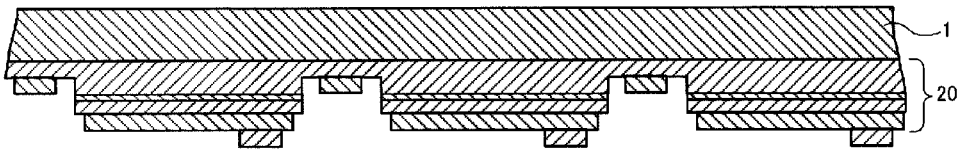
FIGS. 8A to 8F are a set of schematic sectional views illustrating another example of steps for manufacturing semiconductor light-emitting devices according to the third embodiment of the invention.

In the second example of the method for manufacturing the semiconductor light-emitting devices 100 of the third embodiment of the invention, the semiconductor layer 20 may be formed by the same step as in the first example of the manufacturing method (FIG. 8A).

Figure 8B:
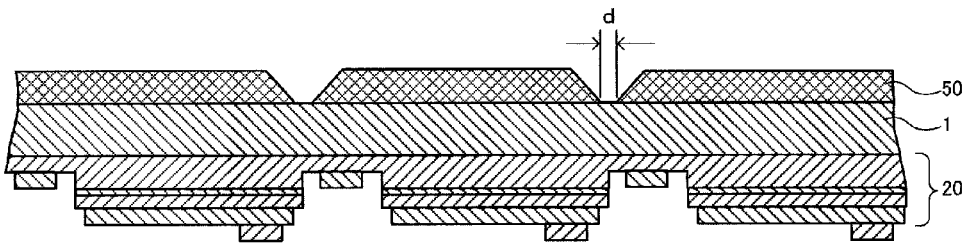

In the second example of the manufacturing method of the third embodiment, a mask pattern of a resist film 50 is formed by a photolithographic process on the second principal surface (FIG. 8B). The resist film 50 is formed such that the mask pattern is not present on the region serving as a cut section during dicing. In the example illustrated in FIG. 8B, the mask pattern of the resist film 50 is disposed to allow for the formation of a groove 54 having a width d. To facilitate the formation of stacked structure 30 on the side surface 1a of the translucent substrate 1 in the subsequent steps, the width d of the groove 54 is preferably 20 to 60 µm.

Figure 8C:
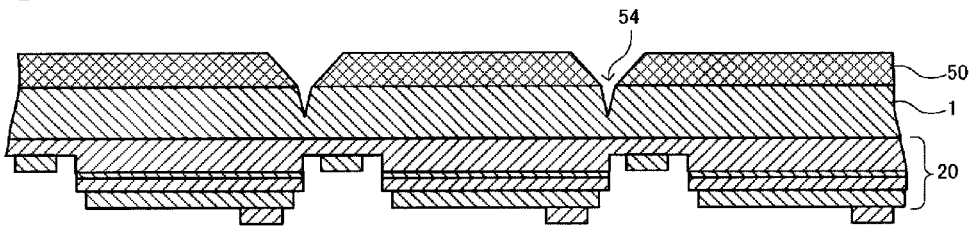
Figure 8D:
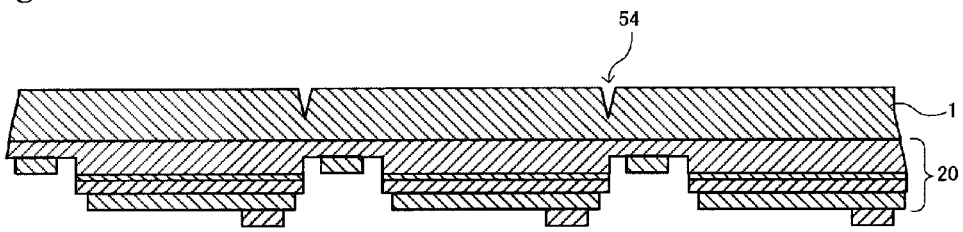

Next, the region of the translucent substrate 1 which will serve as a cut section during dicing is etched by a method such as reactive ion etching while using the resist film 50 as the mark pattern, thereby forming a groove 54 (FIG. 8C). To ensure that a stacked structure 30 will extend to the side surface 1a of the translucent substrate 1 and that the wafer can be divided into chips easily, the depth of the groove 54 may be preferably 2 to 40 µm, and more preferably 5 to 10 µm. The resist film 50 is removed after the groove 54 is formed (FIG. 8D).

Next, a stacked structure 30 including a first metal layer 8 is formed. First, a prescribed material is applied to the entirety of the second principal surface of the grooved translucent substrate 1 by a method such as sputtering or vapor deposition to form a film as the first metal layer 8. The first metal layer 8 may be formed before the resist film 50 is formed. In such a case, the groove 54 is formed also in the first metal layer 8.

Next, a second metal layer 9 is stacked on the entirety of the second principal surface on which the first metal layer 8 and optionally other layers are disposed, by the application of a prescribed material by a method such as sputtering. Because the groove 54 has been formed in the translucent substrate 1 at the location at which the wafer will be divided into chips, the second metal layer 9 may be formed in such a manner that the prescribed material for the second metal layer 9 penetrates and extends to the side surface 1a. As a result, the second metal layer 9 is disposed around the first metal layer 8 and in contact with the side surface 1a.

Figure 8E:
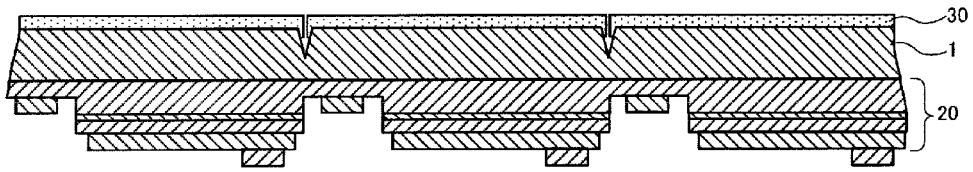

Next, an intermediate layer 10 and a third metal layer 11 are formed by a method such as sputtering or vapor deposition similarly to the second metal layer 9. In this manner, a stacked structure 30 can be formed on the second principal surface of the grooved translucent substrate 1. By the above procedures, the semiconductor light-emitting devices 100 of the third embodiment including the region which serves as a cut section during dicing are produced (FIG. 8E).

Figure 8F:
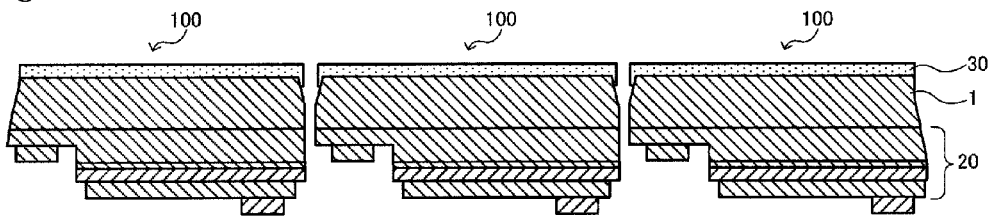

After the semiconductor layer 20 is formed on the first principal surface of the translucent substrate 1 and the stacked structure 30 is formed on the second principal surface which includes the first metal layer 8, the second metal layer 9, the intermediate layer 10 and the third metal layer 11, the cut section defined by the groove 54 is cut to divide the wafer into individual chips as the semiconductor light-emitting devices 100 (FIG. 8F).

The semiconductor light-emitting devices 100 of the third embodiment illustrated in FIG. 6 may be manufactured by the second example of the manufacturing method described above.

Fourth Embodiment

The configuration of a semiconductor light-emitting device 100 according to the fourth embodiment of the invention will be described with reference to FIG. 9 and FIG. 10. As illustrated in FIG. 9 and FIG. 10 as examples, the semiconductor light-emitting device 100 of the fourth embodiment is different from the semiconductor light-emitting device 100 of the first embodiment illustrated in FIG. 1 in that the second metal layer 9 is replaced by a dielectric multilayer film 19.

The configuration of the semiconductor light-emitting device 100 according to the fourth embodiment will be described with reference to FIG. 9 and FIG. 10. Components common to the semiconductor light-emitting device 100 in the first embodiment shown in FIG. 1 will be assigned with the same reference numbers, and the explanations of such components will be omitted arbitrarily.

As illustrated in FIG. 9 and FIG. 10, the semiconductor light-emitting device 100 of the fourth embodiment includes a translucent substrate 1 having translucent properties and a semiconductor layer 20 including an emitting layer 3 on a principal surface on one side (a first principal surface) of the translucent substrate 1. The translucent substrate 1 and the semiconductor layer 20 may be similar to the translucent substrate 1 and the semiconductor layer 20 in the first embodiment.

In the semiconductor light-emitting device 100 of the fourth embodiment of the invention illustrated in FIG. 9, a stacked structure 30 in which a first metal layer 8, a first metal layer-covering layer 12, a dielectric multilayer film 19, an intermediate layer 10 and a third metal layer 11 are sequentially stacked on top of one another is disposed on the principal surface on the other side (the second principal surface) of the translucent substrate 1. In the semiconductor light-emitting device 100 of the fourth embodiment of the invention illustrated in FIG. 10, a fourth metal layer 17 is further disposed between the dielectric multilayer film 19 and the intermediate layer 10 in addition to the configuration of the semiconductor light-emitting device 100 illustrated in FIG. 9.

The first metal layer 8, the first metal layer-covering layer 12, the intermediate layer 10 and the third metal layer 11 in the fourth embodiment may be similar to those in the stacked structure 30 in the first embodiment. In the semiconductor light-emitting device 100 of the fourth embodiment, the configuration is different from the configuration of the first embodiment in that the second metal layer 9 is replaced by the dielectric multilayer film 19 as described below.

In the semiconductor light-emitting device 100 of the fourth embodiment of the invention, the dielectric multilayer film 19 is disposed relative to the first metal layer 8 and the translucent substrate 1 in the same arrangement as the second metal layer 9 in the first embodiment. That is, in the semiconductor light-emitting device 100 of the fourth embodiment of the invention, the dielectric multilayer film 19 is disposed around the first metal layer 8. Further, the dielectric multilayer film 19 is disposed in contact with at least the second principal surface or the side surface 1a of the translucent substrate 1. In the example illustrated in FIG. 9, the dielectric multilayer film 19 exhibiting high adhesion to the translucent substrate 1 is disposed in contact with a portion of the second principal surface. The dielectric multilayer film 19 can reinforce the adhesion of the first metal layer 8 with respect to the translucent substrate 1 by covering the first metal layer 8 in an enclosing manner while having a partial contact with the second principal surface. Thus, it becomes possible to suppress the peeling of the first metal layer 8 (the reflective layer) disposed in contact with the second principal surface of the translucent substrate 1.

For example, the dielectric multilayer film 19 may be obtained by repeating the sequential application of a pair of $Nb_2O_5$ and $SiO_2$ three times. The dielectric multilayer film 19 formed by such a method can achieve a high adhesion with respect to the translucent substrate 1 at the region in which the dielectric multilayer film 19 is in contact with the surface of the translucent substrate 1. Further, the formation of the dielectric multilayer film 19 around the first metal layer 8 can reliably reinforce the adhesion of the first metal layer 8 with respect to the translucent substrate 1.

The optical transmittance of the dielectric multilayer film 19 is generally higher than that of the metal thin film forming the first metal layer 8. Thus, the example of the semiconductor light-emitting device 100 of the fourth embodiment illustrated in FIG. 10 includes a fourth metal layer 17 made of for example, Pt, Al or an Al alloy between the dielectric multilayer film 19 and the intermediate layer 10. With the fourth metal layer 17, the light which has been transmitted through the dielectric multilayer film 19 can be reflected toward the translucent substrate 1. Consequently, the example of the semiconductor light-emitting device 100 illustrated in FIG. 10 can achieve a higher light emitting efficiency compared to the example shown in FIG. 9.

The semiconductor light-emitting device 100 of the fourth embodiment of the invention having the above structure may be operated similarly to the semiconductor light-emitting device 100 of the first embodiment. Thus, the light emitted from the emitting layer 3 in various directions can be emitted to the outside of the semiconductor light-emitting device 100 through the p-side full-area electrode 6.

(Manufacturing Method)

A method for manufacturing the semiconductor light-emitting devices 100 of the fourth embodiment of the invention will be described. In the fourth embodiment, the steps are carried out while the semiconductor light-emitting devices 100 illustrated in FIG. 9 or FIG. 10 are arranged two-dimensionally as a wafer, and the wafer is divided into chips as the semiconductor light-emitting devices 100.

(Step of Forming Semiconductor Layer 20 on First Principal Surface)

The manufacturing method includes a step of forming a semiconductor layer 20. This step includes a step of forming a semiconductor layer 20 on the first principal surface of a translucent substrate 1, and a step of forming electrodes on the semiconductor layer 20. The semiconductor layer 20 and the electrodes thereon may be formed by the same methods as described in the manufacturing method of the first embodiment.

(Step of Forming Stacked Structure 30 Including First Metal Layer 8 on Second Principal Surface)

After the semiconductor layer 20 is formed on the first principal surface, a stacked structure 30 including a first metal layer 8 and a first metal layer-covering layer 12 is formed on the second principal surface which is the backside of the first principal surface. The first metal layer 8 and the first metal layer-covering layer 12 may be formed by the same methods as described in the manufacturing method of the first embodiment.

Next, similarly to the manufacturing method in the first embodiment, a laser beam 44 is applied to the translucent substrate 1 and is focused to a focal point 46 which serves as a cut section during dicing. This step performs only the application of the laser beam 44 and does not include dicing of the wafer into chips.

Next, a prescribed material is applied to the entirety of the second principal surface including the region serving as a cut section during dicing and the region in which the layers such as the first metal layer 8 are disposed, by a method such as sputtering, thereby stacking a dielectric multilayer film 19. In this step, the dielectric multilayer film 19 is formed in contact with the second principal surface of the translucent substrate 1 at the outside of the outer periphery of the first metal layer 8 and the first metal layer-covering layer 12. As a result, the dielectric multilayer film 19 covers the first metal layer 8 and the first metal layer-covering layer 12 in an enclosing manner.

Preferably, a fourth metal layer 17 is formed by a method such as sputtering or vapor deposition after the formation of the dielectric multilayer film 19 and before the formation of an intermediate layer 10. By the formation of the fourth metal layer 17, the light transmitted through the dielectric multilayer film 19 can be reflected toward the translucent substrate 1.

Next, an intermediate layer 10 and a third metal layer 11 are formed by a method such as sputtering or vapor deposition similarly to the manufacturing method of the first embodiment.

By the above procedures, the semiconductor light-emitting devices 100 of the fourth embodiment including the region which serves as a cut section during dicing are produced. In the semiconductor light-emitting devices 100, the semiconductor layer 20 is disposed on the first principal surface of the translucent substrate 1 and the stacked structure 30 is disposed on the second principal surface which includes the first metal layer 8, the first metal layer-covering layer 12, the dielectric multilayer film 19, the intermediate layer 10 and the third metal layer 11. Where necessary, the fourth metal layer 17 is disposed between the dielectric multilayer film 19 and the intermediate layer 10. Similarly to the manufacturing method of the first embodiment, the cut section which has been irradiated with the laser beam 44 is cut to divide the wafer into individual chips as the semiconductor light-emitting devices 100.

The semiconductor light-emitting devices 100 of the fourth embodiment illustrated in FIG. 9 and FIG. 10 may be manufactured by the aforementioned manufacturing method.

EXAMPLES

Hereinbelow, Examples of the present invention will be described.

In Examples, the die shear strength of a stacked structure 30 in a semiconductor light-emitting device 100 was measured. The die shear strength is a shear strength measured in terms of the load required for detaching the stack stacked structure 30 by pushing the semiconductor chip from the side in a horizontal direction at room temperature or an elevated temperature. A known die shear strength tester is used for the measurement. The die shear strength is specified in the JEITA standards (EIAJ ED4703) or the MIL standards (MIL-STD-883C).

Example 1

An n-type nitride semiconductor layer, an active layer including InGaN (an emitting layer 3) and a p-type nitride semiconductor layer are stacked on a principal surface of a sapphire wafer (a translucent substrate 1), and an n-side electrode 5 formation site is created by removing the corresponding regions of the p-type nitride semiconductor layer, the active layer and a part of the n-type nitride semiconductor layer. An n-side electrode 5 is formed on the exposed n-type nitride semiconductor layer, and a translucent p-side full-area electrode 6 of ITO is formed on the entire surface of the p-type nitride semiconductor layer. Further, a p-side pad electrode 7 is formed on a portion of the translucent p-side full-area electrode 6.

On the principal surface (the second principal surface) of the translucent sapphire substrate 1 which was opposite to the principal surface having the stack of the nitride semiconductor layers (the first principal surface), a mask pattern of a resist film 50 was formed by a photolithographic process on a region of the second principal surface, which included a region in which a second metal layer 9 was to be formed and a region serving as a cut section during dicing. Next, Ag was stacked on the entire surface by a sputtering method with a film thickness of 120 nm, thereby forming a first metal layer 8. The resist film 50 was removed from the outside of the outer periphery of the first metal (Ag) layer 8. Next, a mask pattern of a resist film 50 was formed by a photolithographic process similarly to the formation of the first metal layer 8. Next, Ni was stacked by a sputtering method with a film thickness of 100 nm, thereby forming a first metal layer-covering layer 12. Thereafter, the resist film 50 was removed.

Next, a laser beam 44 was applied along the cut section in the region of the translucent sapphire substrate 1 which had been exposed as a result of the removal of the resist film 50.

Next, Al with a film thickness of 300 nm was stacked by a sputtering method, thereby forming a second metal layer 9. Subsequently, W with a film thickness of 700 nm and Pt with a film thickness of 200 nm were sequentially sputtered to form a first intermediate layer 15 and a second intermediate layer 16, respectively, thereby forming an intermediate layer 10. Lastly, a third metal layer 11 was formed by stacking Au—Sn with a film thickness of 3500 nm. By the above procedures, a stacked structure 30 was formed on the second principal surface which included the first metal layer 8, the first metal layer-covering layer 12, the second metal layer 9, the intermediate layer 10 and the third metal layer 11.

Next, the cut section which had been irradiated with the laser beam 44 was cut to divide the wafer into individual chips as semiconductor light-emitting devices 100. In this manner, the semiconductor light-emitting devices 100 of Example 1 representing the first embodiment shown in FIG. 1 were obtained.

With respect to the semiconductor light-emitting devices 100 of Example 1, the die shear strength of the stacks 30 was measured. As a result, the stacks 30 in the semiconductor light-emitting devices 100 of Example 1 had a die shear strength 1.3 to 2.3 times higher than the die shear strength of stacks 30 in semiconductor light-emitting devices 100 of Comparative Example 1 described later in which the second metal layer 9 was not formed in contact with the translucent substrate 1. Further, the semiconductor light-emitting devices 100 of Example 1 were mounted on boards with the third metal (Au—Sn) layer 11 as the adhesive, and their characteristics were evaluated. The semiconductor devices exhibited a high luminous output and good light distribution characteristics.

Example 2

Semiconductor light-emitting devices 100 of Example 2 representing the second embodiment were manufactured by the same steps as in Example 1, except that the second metal (Ag) layer 9 was replaced by an adhesive portion 9a and a cover portion 9b illustrated in FIG. 4. The adhesive portion 9a was formed of Al, an Al alloy or a Ag alloy with a total film thickness of 220 nm having the first metal layer 8 (film thickness 120 nm) and the first metal layer-covering layer 12 (film thickness 100 nm). The cover portion 9b was formed by stacking Al with a film thickness of 300 nm. In this manner, the semiconductor light-emitting devices 100 of Example 2 representing the second embodiment shown in FIG. 4 were obtained.

Example 3

Semiconductor light-emitting devices 100 of Example 3 were manufactured by the steps illustrated in FIG. 7. First, similarly to Example 1, nitride semiconductor layers were stacked on the first principal surface of a translucent sapphire substrate 1. Next, a laser beam 44 was applied to the translucent substrate 1 and was focused to a focal point 46 which would serve as a cut section during dicing (FIG. 7A). Next, the cut section irradiated with the laser beam 44 was cut to divide the wafer into individual chips as semiconductor light-emitting devices 100b which were precursors of semiconductor light-emitting devices 100 before the formation of stacked structure 30 (FIG. 7B).

A stacked structure 30 including a first metal layer 8 was formed on the second principal surface which was the backside of the semiconductor light-emitting devices 100b in the form of chips. In detail, Ag was sputtered onto the entirety of the second principal surface of the translucent substrate 1 in the form of chips to form a first metal layer 8 with a film thickness of 120 nm. Next, Ni was stacked to form a second metal layer 9 with a film thickness of 100 nm. In this step, the second metal (Ni) layer 9 was formed to extend to a side surface 1a.

Next, similarly to the second metal layer 9, Rh was sputtered to form an intermediate layer 10 with a film thickness of 200 nm. Lastly, a third metal layer 11 was formed by stacking Au—Sn with a film thickness of 3500 nm. By the above procedures, a stacked structure 30 was formed on the second principal surface which included the first metal layer 8, the second metal layer 9, the intermediate layer 10 and the third metal layer 11 (FIG. 7C). In this manner, the semiconductor light-emitting devices 100 of Example 3 representing the third embodiment shown in FIG. 6 were obtained.

Example 4

Semiconductor light-emitting devices 100 of Example 4 representing the fourth embodiment were manufactured by the same steps as in Example 1, except that the second metal (Ag) layer 9 was replaced by a dielectric multilayer film 19 as illustrated in FIG. 9. The dielectric multilayer film 19 was a $Nb_2O_3/SiO_2$ stack. In this example, the intermediate layer 10 was formed by stacking Ti as a first intermediate layer 15 with a film thickness of 3 to 10 nm and Pt or Rh as a second intermediate layer 16 with a film thickness of 200 nm.

Example 5

Semiconductor light-emitting devices 100 of Example 5 representing the fourth embodiment were manufactured by the same steps as in Example 4, except that a fourth metal layer 17 was formed using Al after the formation of the dielectric multilayer film 19 and before the formation of the intermediate layer 10. In Example 5, the intermediate layer 10 was formed by stacking W as a first intermediate layer 15 with a film thickness of 700 nm and Pt as a second intermediate layer 16 with a film thickness of 200 nm.

Comparative Example 1

Semiconductor light-emitting devices 100 of Comparative Example 1 were manufactured by the same steps as in Example 1, except that the first metal layer 8 was formed on the entirety of the second principal surface. That is, the second metal layer 9 in the semiconductor light-emitting devices 100 of Comparative Example 1 was not in contact with the translucent substrate 1.

The die shear strength of the stacks 30 in the semiconductor light-emitting devices 100 of Comparative Example 1 was measured. As a result, the die shear strength of the stacks 30 in the semiconductor light-emitting devices 100 of Comparative Example 1 was lower than the die shear strength of the stacks 30 in the semiconductor light-emitting devices 100 of Examples 1 to 5.

The invention claimed is:

1. A semiconductor light-emitting device comprising:
a translucent substrate having a first principal surface, a second principal surface and a side surface, wherein the side surface is in contact with the first principal surface and the second principal surface,
a semiconductor layer disposed on the first principal surface of the translucent substrate,
a first metal layer disposed in contact with the second principal surface of the translucent substrate,
a second metal layer disposed in contact with at least the second principal surface or the side surface of the translucent substrate around the first metal layer, and
a third metal layer disposed on the second metal layer,
wherein the first metal layer has a reflectance with respect to a peak wavelength of light emitted from an emitting layer higher than the reflectance of the second metal layer, and
the second metal layer has an adhesion with respect to the translucent substrate higher than the adhesion between the first metal layer and the translucent substrate.

2. The semiconductor light-emitting device according to claim 1, wherein the second metal layer is disposed in contact with only the second principal surface of the surfaces of the translucent substrate.

3. The semiconductor light-emitting device according to claim 2, wherein the second metal layer is disposed to continuously cover the second principal surface and the top surface of the first metal layer.

4. The semiconductor light-emitting device according to claim 1, wherein the second metal layer comprises an adhesive portion disposed in contact only with a portion of the second principal surface, and a cover portion disposed in contact with the entire top surface of the first metal layer, the adhesive portion and the cover portion comprising materials different from each other.

5. The semiconductor light-emitting device according to claim 1, wherein the first metal layer is disposed on the entirety of the second principal surface, and
the second metal layer is disposed in contact with the side surface of the translucent substrate.

6. The semiconductor light-emitting device according to claim 1, wherein the first metal layer comprises one selected from Ag, Ag alloys, Rh and Pt.

7. The semiconductor light-emitting device according to claim 1, wherein the first metal layer comprises Ag and the translucent substrate comprises sapphire.

8. The semiconductor light-emitting device according to claim 7, wherein the second metal layer comprises Al, Ni, Ti or an Al alloy.

9. The semiconductor light-emitting device according to claim 8, wherein the third metal layer comprises Au—Sn or Pd—Sn.

10. The semiconductor light-emitting device according to claim 1, further comprising a first metal layer-covering layer between the first metal layer and the second metal layer to prevent the material of the first metal layer from being diffused toward the second metal layer.

11. The semiconductor light-emitting device according to claim 10, wherein the first metal layer-covering layer comprises Ni.

12. The semiconductor light-emitting device according to claim 1, further comprising an intermediate layer between the second metal layer and the third metal layer to prevent the material of the third metal layer from being diffused into the first metal layer.

13. The semiconductor light-emitting device according to claim 12, wherein the intermediate layer comprises a second intermediate layer disposed in contact with the third metal layer, and the second intermediate layer comprises a material including one selected from Pt, Rh and alloys thereof.

14. The semiconductor light-emitting device according to claim 13, wherein the intermediate layer further comprises a first intermediate layer disposed between the second intermediate layer and the second metal layer, and the first intermediate layer comprises a material including one selected from Ti, W and alloys thereof.

15. A semiconductor light-emitting device comprising:
a translucent substrate having a first principal surface, a second principal surface and a side surface, wherein the side surface is in contact with the first principal surface and the second principal surface,
a semiconductor layer disposed on the first principal surface of the translucent substrate,
a first metal layer disposed in contact with the second principal surface of the translucent substrate,
a second metal layer disposed in contact with at least the second principal surface or the side surface of the translucent substrate around the first metal layer and including a material different from that of the first metal layer, and
a third metal layer disposed on the second metal layer.

16. The semiconductor light-emitting device according to claim 15, wherein the first metal layer comprises one selected from Ag, Ag alloys, Rh and Pt.

17. The semiconductor light-emitting device according to claim 15, wherein the first metal layer comprises Ag and the translucent substrate comprises sapphire.

18. The semiconductor light-emitting device according to claim 17, wherein the second metal layer comprises Al, Ni, Ti or an Al alloy.

19. The semiconductor light-emitting device according to claim 18, wherein the third metal layer comprises Au—Sn or Pd—Sn.

20. A semiconductor light-emitting device comprising:
- a translucent substrate having a first principal surface, a second principal surface and a side surface, wherein the side surface is in contact with the first principal surface and the second principal surface,
- a semiconductor layer disposed on the first principal surface of the translucent substrate,
- a first metal layer disposed in contact with the second principal surface of the translucent substrate,
- a dielectric multilayer film disposed in contact with at least the second principal surface or the side surface of the translucent substrate around the first metal layer, and
- a third metal layer disposed on the dielectric multilayer film.

21. The semiconductor light-emitting device according to claim 20, wherein the dielectric multilayer film is disposed to cover the top surface of the first metal layer.

22. The semiconductor light-emitting device according to claim 20, wherein the dielectric multilayer film has an adhesion with respect to the translucent substrate higher than the adhesion between the first metal layer and the translucent substrate, and the first metal layer includes a material containing Ag.

23. The semiconductor light-emitting device according to claim 20, wherein the first metal layer comprises one selected from Ag, Ag alloys, Rh and Pt.

24. The semiconductor light-emitting device according to claim 20, wherein the first metal layer comprises Ag and the translucent substrate comprises sapphire.

25. The semiconductor light-emitting device according to claim 24, wherein the second metal layer comprises Al, Ni, Ti or an Al alloy.

26. The semiconductor light-emitting device according to claim 25, wherein the third metal layer comprises Au—Sn or Pd—Sn.

27. A method for manufacturing a semiconductor light-emitting device having:
- a translucent substrate having a first principal surface, a second principal surface and a side surface, wherein the side surface is in contact with the first principal surface and the second principal surface;
- a semiconductor layer disposed on the first principal surface of the translucent substrate;
- a first metal layer disposed in contact with the second principal surface of the translucent substrate;
- a second metal layer disposed in contact with at least the second principal surface or the side surface of the translucent substrate around the first metal layer; and
- a third metal layer disposed on the second metal layer,
- the method comprising a step of forming the second metal layer from the side of the second principal surface which is the backside of the semiconductor light-emitting devices in the form of chips.

* * * * *